US008896473B2

(12) United States Patent
Dix

(10) Patent No.: US 8,896,473 B2
(45) Date of Patent: Nov. 25, 2014

(54) DIGITAL-TO-ANALOG-CONVERTER WITH RESISTOR LADDER

(71) Applicant: Microchip Technology Incorporated, Chandler, AZ (US)

(72) Inventor: Gregory Dix, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/897,955

(22) Filed: May 20, 2013

(65) Prior Publication Data

US 2013/0314263 A1 Nov. 28, 2013

Related U.S. Application Data

(60) Provisional application No. 61/650,653, filed on May 23, 2012.

(51) Int. Cl.
| | |
|---|---|
| *H03M 1/66* | (2006.01) |
| *H03M 1/06* | (2006.01) |
| *H03M 1/78* | (2006.01) |
| *H03M 1/76* | (2006.01) |
| *H03M 1/68* | (2006.01) |

(52) U.S. Cl.
CPC .............. *H03M 1/785* (2013.01); *H03M 1/765* (2013.01); *H03M 1/06* (2013.01); *H03M 1/682* (2013.01)
USPC .......................................... 341/145; 341/144

(58) Field of Classification Search
CPC ........ H03M 1/747; H03M 1/00; H03M 1/785
USPC ................................... 341/145, 144, 154, 153
See application file for complete search history.

(56) References Cited

U.S. PATENT DOCUMENTS

| 5,943,000 | A | 8/1999 | Nessi et al. .................... 341/154 |
| 7,136,002 | B2 * | 11/2006 | Dempsey et al. ............. 341/145 |
| 2007/0052569 | A1 | 3/2007 | Saito et al. ..................... 341/154 |
| 2011/0102227 | A1 | 5/2011 | Motamed ....................... 341/154 |

OTHER PUBLICATIONS

International Search Report and Written Opinion, Application No. PCT/US2013/042362, 11 pages, Aug. 6, 2013.

* cited by examiner

*Primary Examiner* — Joseph Lauture
(74) *Attorney, Agent, or Firm* — King & Spalding L.L.P.

(57) ABSTRACT

A digital-to analog-converter (DAC) has a MSB resistor ladder with a plurality of series connected resistors, wherein the MSB resistor ladder is coupled between a first and second reference potential, a LSB resistor ladder with a plurality of series connected resistors, and a plurality of switching units for connecting one of the series connected resistors of the MSB resistor ladder with the LSB resistor ladder, wherein each switching unit has a first switch for connecting a first terminal of an associated MSB resistor with a first terminal of the LSB resistor ladder and a second switch for connecting a second terminal of the associated MSB resistor with a second terminal of the LSB resistor ladder and wherein each switch is configured form a resistor of similar value of the resistors of the LSB resistor ladder when switched on.

26 Claims, 10 Drawing Sheets

DIGITAL-TO-ANALOG-CONVERTER WITH RESISTOR LADDER

CROSS-REFERENCE TO RELATED APPLICATIONS

This application claims the benefit of U.S. Provisional Application No. 61/650,653 filed on May 23, 2012, which is incorporated herein in its entirety.

TECHNICAL FIELD

The present disclosure relates to digital-to-analog-converters.

BACKGROUND

Various Digital-to-Analog-Converter (DAC) designs exist. For example, DACs may use a resistor ladder for the most significant bits (MSB) and a separate resistor ladder for the least significant bits (LSB). These networks need to be coupled appropriately to generate the desired analog value from a digital value consisting of the MSB & LSB. However, DAC designs with such MSB & LSB ladders are limited in accuracy by the switches or methods in projecting the MSB voltage range on the LSB ladder.

SUMMARY

Therefore a need exists, for an improved digital-to-analog-converter. For example, according to various embodiments, p-channel depletion devices (diode connected) are used as both the switching element and the resistive element to eliminate the need for large switches, or Op-amps to project the MSB voltage on the LSB ladder.

A digital-to analog-converter (DAC) may comprise a MSB resistor ladder comprising a plurality of series connected resistors, wherein the MSB resistor ladder is coupled between a first and second reference potential; a LSB resistor ladder comprising a plurality of series connected resistors; and a plurality of switching units for connecting one of said series connected resistors of the MSB resistor ladder with the LSB resistor ladder, wherein each switching unit comprises a first switch for connecting a first terminal of an associated MSB resistor with a first terminal of the LSB resistor ladder and a second switch for connecting a second terminal of the associated MSB resistor with a second terminal of the LSB resistor ladder and wherein each switch is configured form a resistor of similar value of the resistors of the LSB resistor ladder when switched on.

According to a further embodiment, the digital-to analog-converter may further comprise a decoder for controlling one of the switching units to connect an associated resistor of the MSB resistor ladder with the LSB resistor ladder and for selecting one of a plurality of tapping nodes of the LSB resistor ladder for providing an output voltage of the DAC. According to a further embodiment, each tapping node can be coupled with an output of the LSB resistor ladder by an N-channel field effect transistor. According to a further embodiment, each first and second switch of the plurality of switching units can be formed by a p-channel depletion field effect transistor. According to a further embodiment, the LSB resistor ladder can be formed by a plurality of p-channel depletion transistors connected as diodes. According to a further embodiment, the LSB resistor ladder can be formed by a plurality of sub LSB resistor ladders coupled in series. According to a further embodiment, each switching unit may have a first and a second output connected with the first and second switch, respectively and further comprises a third switch for directly connecting the second terminal of an associated MSB resistor with a third output, wherein the first of the sub LSB resistor ladders is connected with the first output and the last of the sub LSB resistor ladders is connected with the second and third output. According to a further embodiment, the third switch can be an N-channel field effect transistor. According to a further embodiment, each of the sub LSB resistor ladders may comprise $2^q$ resistors except for the last sub LSB resistor ladder which comprises $2^q$-2 resistors and wherein the last LSB resistor ladder comprises a direct connection between a third input connected with the third output of the switching unit and a LSB resistor ladder output. According to a further embodiment. According to a further embodiment, q can be 32. According to a further embodiment, the MSB resistor ladder may comprise $2^p$ resistors and an effective LSB resistor ladder formed by a switching unit and the LSB resistor ladder comprises $2^m$ resistors. According to a further embodiment, p can be 32 and m can be 128. According to a further embodiment, the first reference potential can be one half of a supply voltage and the second reference potential is ground. According to a further embodiment, the digital-to analog-converter may further comprise a compensation circuit for each resistor of the MSB resistor ladder. According to a further embodiment, each compensation circuit can be controlled depending on a MSB input value. According to a further embodiment, the first reference potential can be provided by a reference resistor ladder coupled in series with the MSB resistor ladder. According to a further embodiment, the digital-to analog-converter may further comprise compensation circuits for each resistor of the reference resistor ladder.

According to another embodiment, a method of generating an analog voltage from a digital value may comprise the steps of: providing an MSB resistor ladder comprising a plurality of series connected resistors between a first and second reference potential; providing an LSB resistor ladder comprising a plurality of series connected resistors; depending on an MSB value selectively connecting a first terminal of a selected MSB resistor with a first terminal of the LSB resistor ladder by a first switch and connecting a second terminal of the selected MSB resistor with a second terminal of the LSB resistor ladder by a second switch, wherein each switch is configured to form a resistor of similar value of the resistors of the LSB resistor ladder when switched on; and depending on an LSB value selecting a tapping node of the LSB resistor ladder to provide an analog output voltage.

According to a further embodiment of the method, each tapping node can be coupled with an output of the LSB resistor ladder by an N-channel field effect transistor. According to a further embodiment of the method, each first and second switch of the plurality of switching units can be formed by a p-channel depletion field effect transistor. According to a further embodiment of the method, the LSB resistor ladder can be formed by a plurality of p-channel depletion transistors connected as diodes. According to a further embodiment of the method, the LSB resistor ladder can be formed by a plurality of sub LSB resistor ladders coupled in series. According to a further embodiment of the method, the first reference potential can be one half of a supply voltage and the second reference potential is ground. According to a further embodiment of the method, the method may further comprise compensating each resistor value of the MSB resistor ladder depending on the MSB value. According to a further embodiment of the method may further comprise providing the first reference potential by a reference resistor ladder coupled in series with the MSB resistor ladder. According to a further embodiment of the method, the method may further comprise compensating each resistor of the reference resistor ladder.

DETAILED DESCRIPTION

Figure 1:
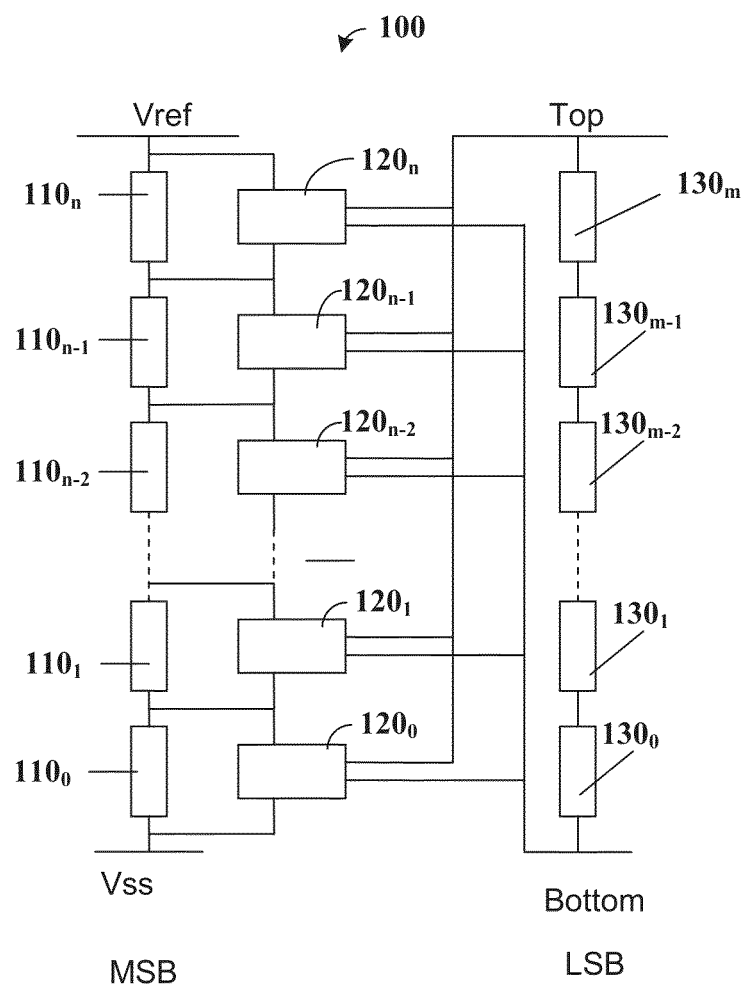
FIG. 1 shows a block diagram of a first conventional DAC.

FIG. 1 shows a conventional DAC with an MSB ladder $110_{0...n}$ and LSB Ladder $130_{0...m}$. The MSB to LSB switches $120_{0...n}$ are usually transfer gate with a finite resistance. Each transfer gate may be designed as a CMOS transfer gate and comprise an NMOS and a complementary PMOS transistor whose source drain paths are switched in parallel. However, other designs may use a single NMOS transistor as a switch. This resistance of these switches causes an error in projecting the MSB voltage across the LSB ladder $130_{0...m}$.

Figure 2:
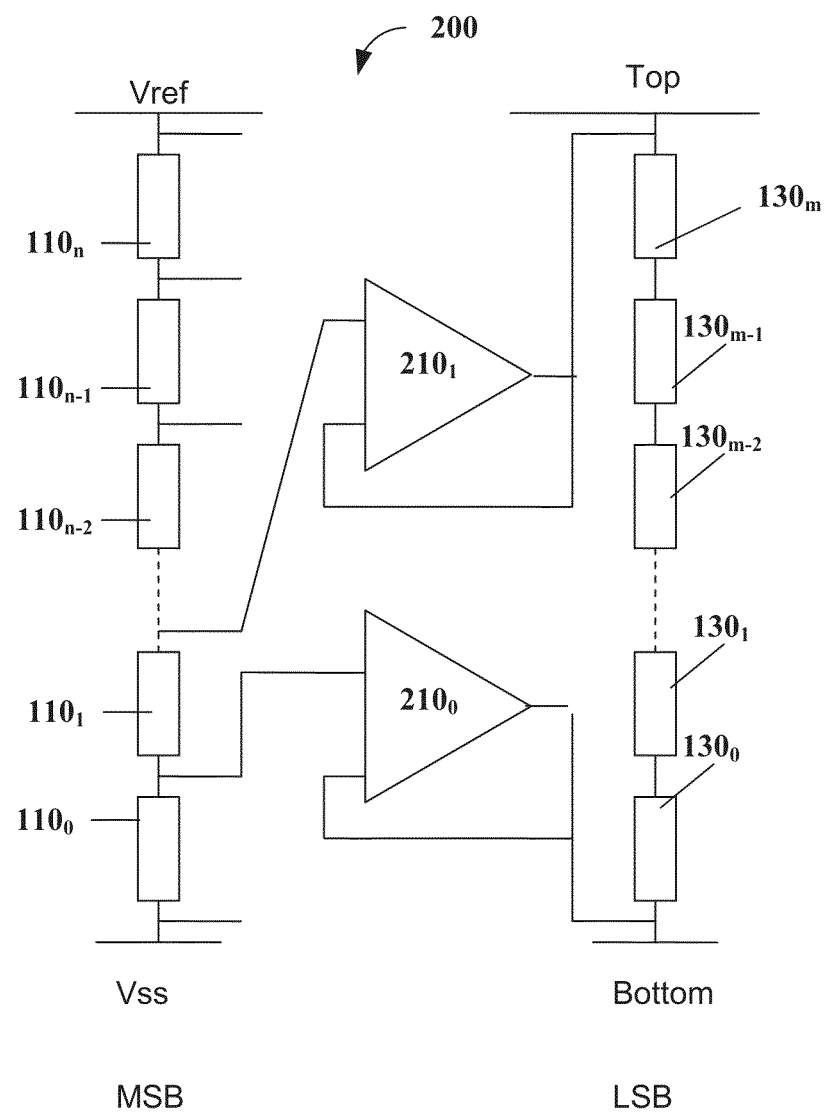
FIG. 2 shows a block diagram of a second conventional DAC.

FIG. 2 shows yet another conventional DAC with MSB ladder $110_{0...n}$ and LSB Ladder $130_{0...m}$. The MSB to LSB is selected by small switches and the voltages are high impedance inputs to a plurality operational amplifiers $210_0 \ldots 210_n$. While this eliminates the resistance issue, this design introduces offset errors from the op-amps, and issues with the low end codes.

Figure 3:
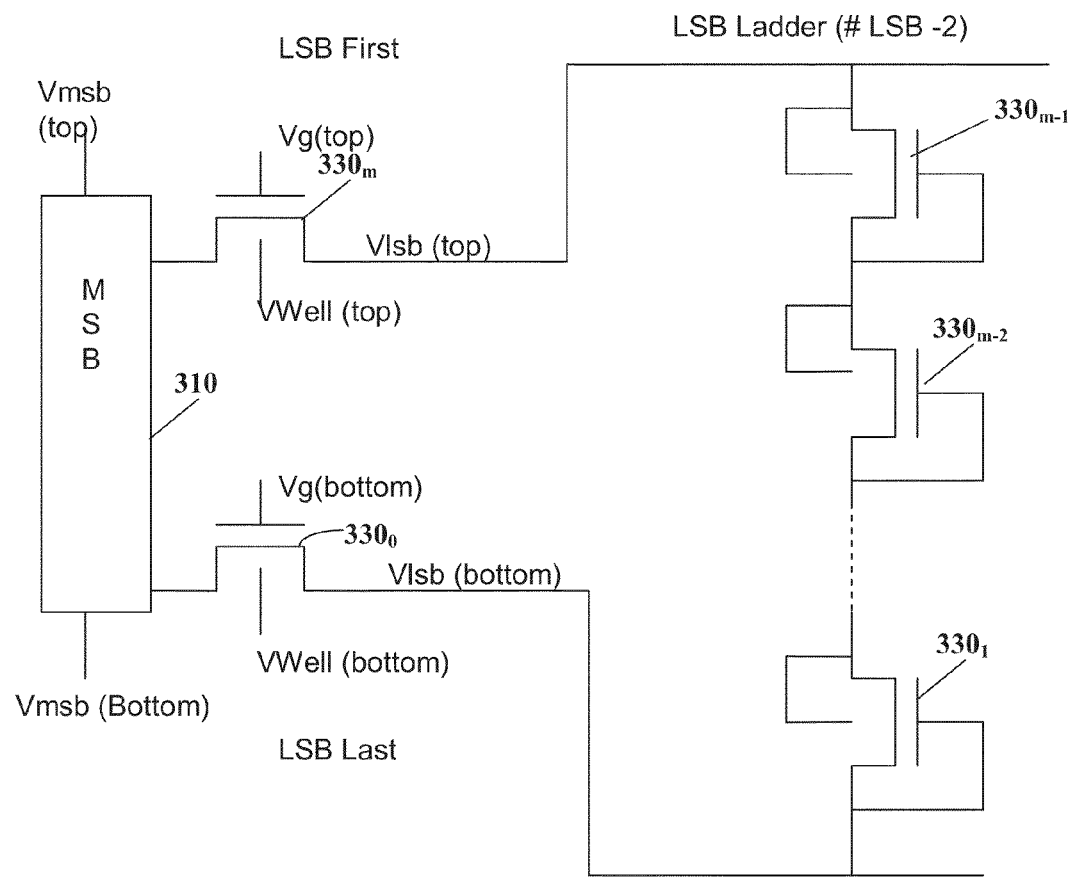
FIG. 3 shows a block diagram of an DAC according to various embodiments of this disclosure.

FIG. 3 shows a new design of a DAC according to various embodiments. The new design comprises P$^+$ resistors for the MSB ladder, and Depletion P-channel MOSFETs for the LSB ladder. FIG. 3 shows a single resistor 310 of the MSB ladder and associated switch unit for connecting the resistor to the LSB ladder from which the output voltage is tapped according to the LSB value. First and last resistor $330_0$ and $330_m$ of the LSB ladder are formed by the transfer switches according to various embodiments. Thus, these switches $330_0$ and $330_m$ are forming the first and last ladder resistors when turned on. The depletion P-channel transistor $330_0$ and $330_m$ used for these switches either entirely block or operates in saturation as a diode depending on a respective control signal as will be explained in more detail with the specific embodiment shown in FIGS. 6-12. Thus, each MSB switching unit associated with an MSB resistor 310 implements two switch units/resistors $330_0$ and $330_m$ of the LSB unit. Each of these switch units/resistor are tied to the remaining LSB ladder $330_{1...m-1}$, and by selecting the voltages created by the MSB ladder the current is steered to the LSB ladder. The output voltages are then tapped from the entire LSB ladder formed by the partial ladder $330_{1...m-1}$ and the respective two switches/resistors of the selected MSB switch unit.

For the active MSB the following equations apply:

$Vg(\text{top})=Vlsb(\text{top})$, and $V\text{Well}(\text{top})=Vmsb(\text{top})$ $Vg(\text{bottom})=Vmsb(\text{bottom})$, and $V\text{Well}(\text{bottom})=Vlsb(\text{bottom})$ For all the other inactive MSB's the following equations apply:

$Vg(\text{top})=Vdd$, and $V\text{Well}(\text{top})=Vdd$ $Vg(\text{bottom})=Vdd$, and $V\text{Well}(\text{bottom})=Vdd$ Note that this scheme will only work if the Vdd>Vref+1V. Typically the Vref is ½ Vdd.

Figure 4:
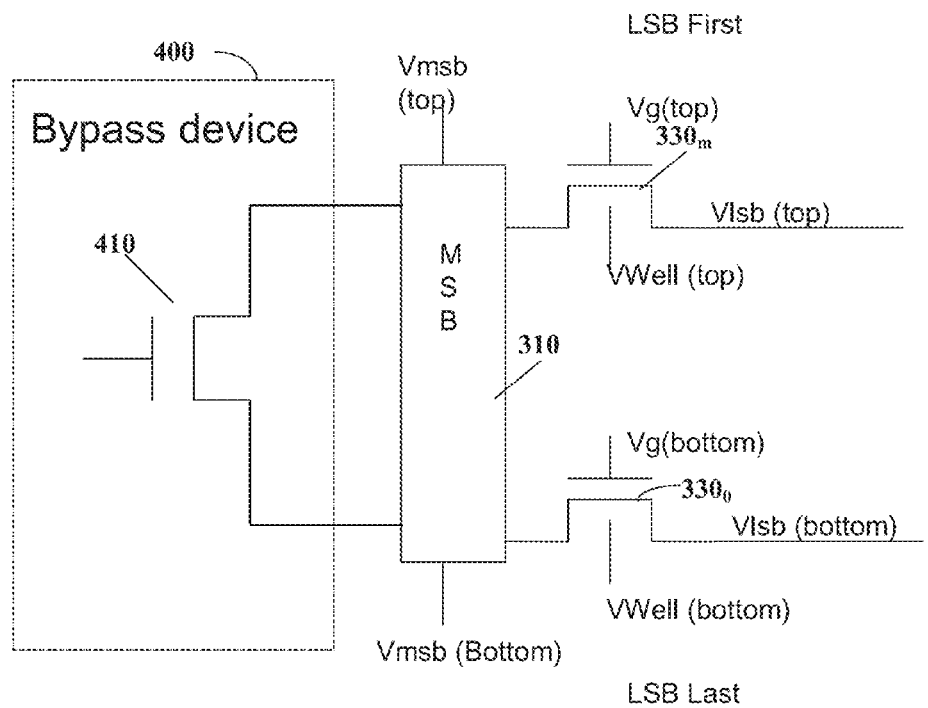
FIG. 4 shows another embodiment of an DAC according to FIG. 3.

FIG. 4 shows an actual bypass switch 400 isolated from the remaining LSB ladder and coupled with the MSB resistor 310 which can be used as a compensation device as will be explained in more detail with the specific embodiment shown in FIGS. 6-12. For the active MSB the total resistance of the MSB is the resistance of the MSB element+the resistance of the LSB. The resistance of the LSB ladder is small, but it can add to the error. To compensate for this an additional bypass device 400 can be enabled in parallel with the MSB element on non-selected MSB's. The bypass device is sized to have the same resistance as the LSB ladder, and is can be a P channel depletion device 410 according to some embodiments.

According to various embodiments, the first and last LSB bit resistors (implemented as p-channel depletion devices $330_0$ and $330_m$) are repeated in each MSB switch unit as the switches coupling the MSB ladder with the LSB ladder. This results in a lean structure as all of the p-channel depletion devices may have the same size and ratio of one switch to the other.

Figure 5:
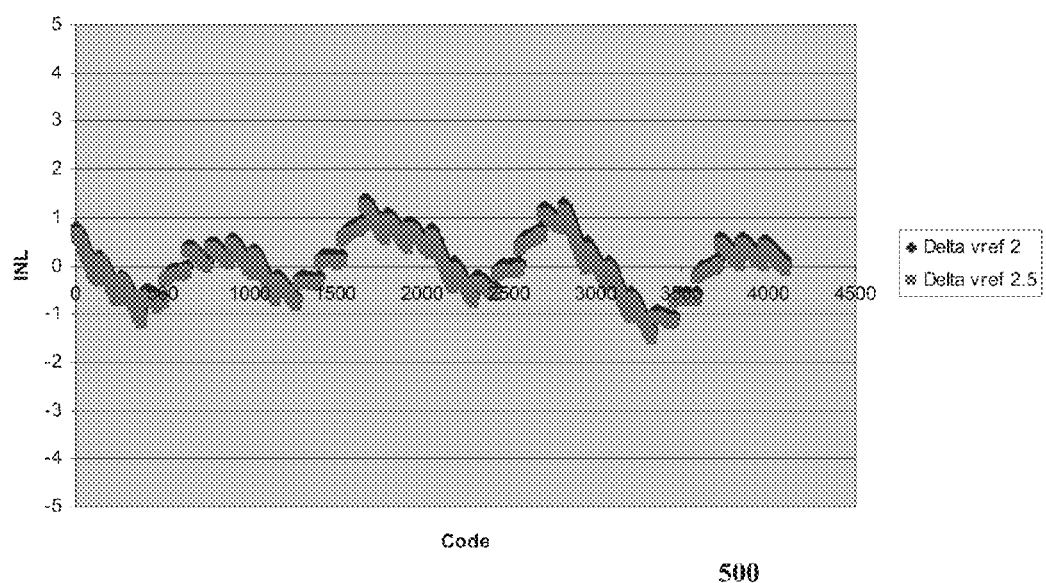
FIG. 5 shows a typical integral nonlinearity (INL) plot of an improved DAC according to various embodiments.

FIG. 5 shows typically associated integral nonlinearity (INL) plots of a 12 bit core on 165 k+/−1 LSB according to various embodiments. As can be seen the worst case measurements yield to less than a +/−1 LSB. The biggest error component result from the mismatch of the MSB elements. Conventional DACs may have INL errors of up to 12 or more LSBs. Hence, a significant improvement can be achieved by the various embodiments of this disclosure.

Figure 6:
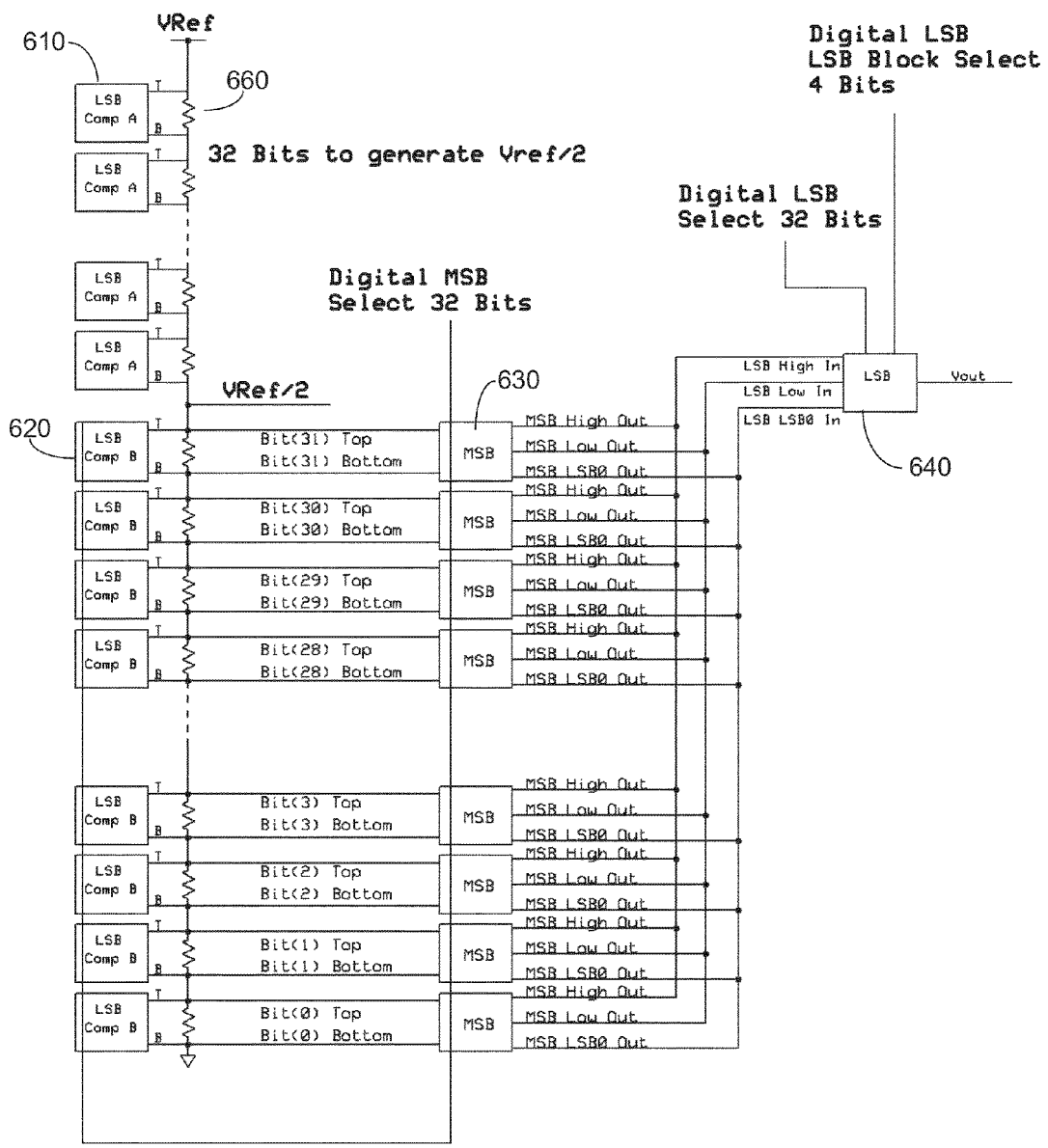
FIG. 6 shows a block diagram of a specific embodiment of a DAC.

FIGS. 6-12 show a specific embodiment which implements the general concept as explained above. However, other implementations are possible. FIG. 6 shows a block diagram according to one embodiment. As shown in FIG. 6, in this embodiment, 64 MSB resistors 660 are used to be connected in series with the reference voltage. This embodiment uses Vref/2, therefore only the bottom 32 MSB resistors 660 are tapped as indicated and coupled with the MSB switch units 630. Hence, according to this embodiment, 5 bits are used for the MSB and determine which one of the 32 MSB resistors will be coupled with the LSB ladder. Other embodiments may use a different ladder to generate Vref/2. According to this specific embodiment, each resistor 660 of the lower 32 resistors can also be connected to a first LSB compensation circuit 620 and each of the upper 32 resistors 660 can be connected to a second LSB compensation circuit 610. According to other embodiments, no specific compensation circuits are implemented and trimming of the MSB ladder can be performed differently.

Figure 7:
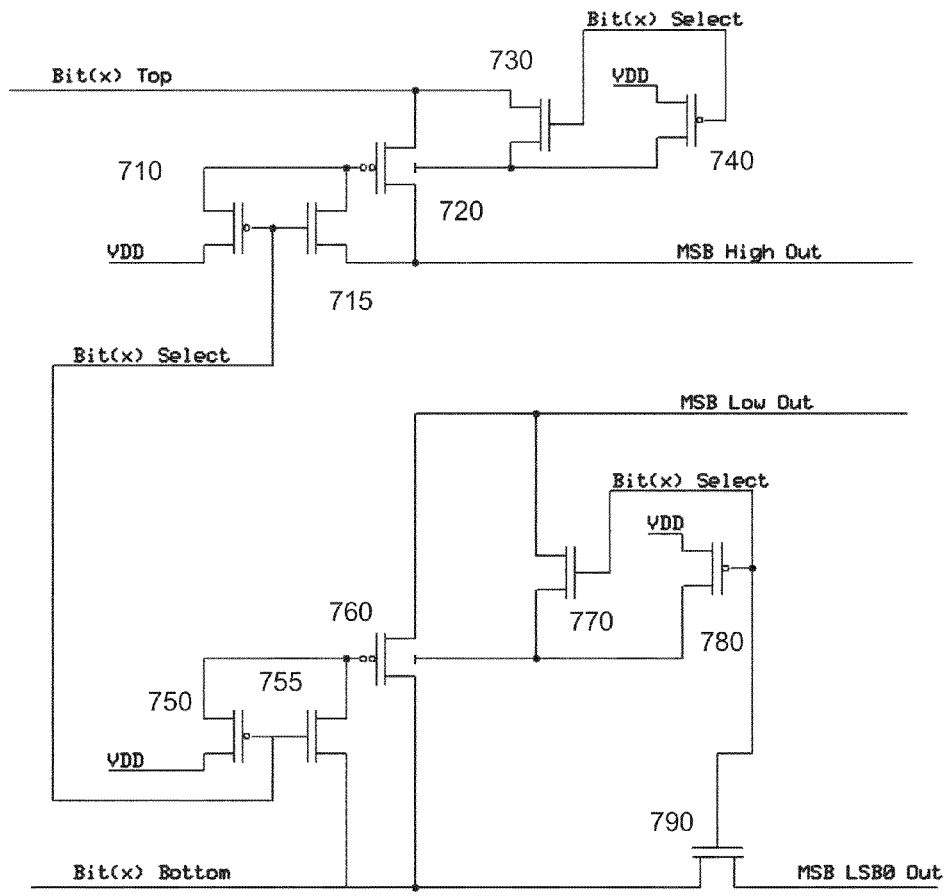
FIG. 7 shows details of the DAC MSB Block of FIG. 6.

According to the embodiment shown in FIG. 6, each MSB unit 630 comprises three outputs, an MSB High Out, an MSB Low Out and an LSB0 Out and is shown in more detail in FIG. 7. This specific design allows to tap all nodes formed by the LSB ladder which according to this specific embodiment comprises four partial 32 resistor ladders. The entire LSB ladder shown in FIG. 6 comprises 128 resistors in series and respective voltage taps.

FIG. 7 shows the switching units in more detail. A P-channel depletion MOSFET 720 is the first connecting switch and also forms the first resistor of a partial ladder 810, 820, 830 (See FIG. 8). This resistor switch 720 couples the Bit(x) top input line with the MSB High output line of the switch unit 630. N-channel MOSFET 730 and P-channel MOSFET 740 connect under control of a respective bit line the bulk of MOSFET 720 with the respective Bit Top line and $V_{DD}$, respectively. The same bit line controls P-channel MOSET 710 and N-Channel MOSFET 715 who connect the gate of MOSFET 720 with VDD and the MSB High Out line, respectively.

Figure 8:
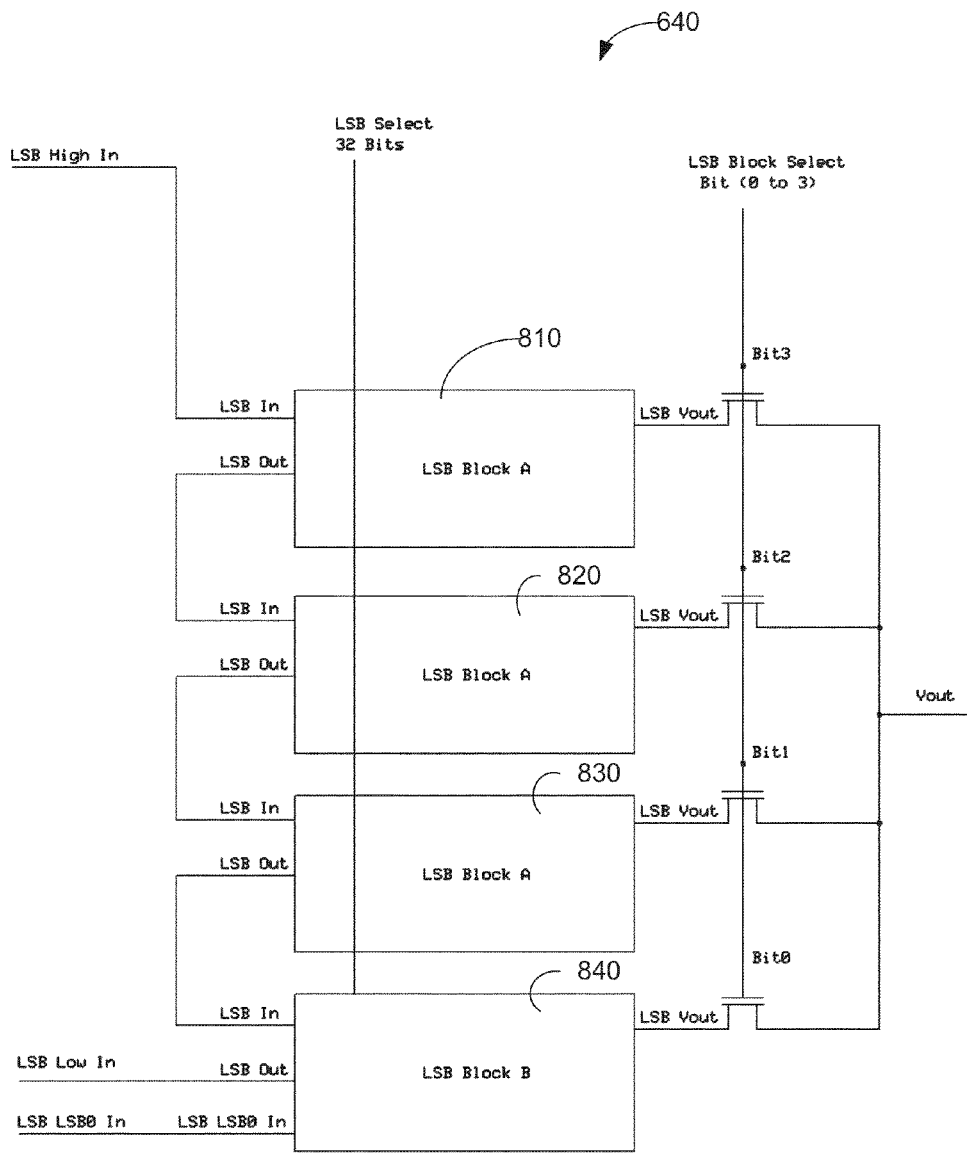
FIG. 8 shows details of the DAC LSB Block of FIG. 6.

A second P-channel depletion MOSFET 760 is the second connecting switch and also forms the last resistor of a partial ladder 810, 820, 830 (See FIG. 8). This resistor switch 760 couples the Bit(x) bottom input with the MSB Low Out line. N-channel and P-channel MOSFETS 770 and 780 are provided and operate similar to MOSFETs 730 and 740. Furthermore, P-channel MOSFET 750 and N-channel MOSFET 755 are provided to operate similar as MOSFETS 710 and 715 with respect to MOSFET 760. In addition, N-channel MOSFET 790 is provided to connect the Bit(x) bottom input directly without forming a resistor with the MSB LSB0 output line under control of the respective bit select line. This arrangement allows for coupling a plurality of partial ladders to the MSB High output line in series. The output of the last block 830 is then connected to the input of the last partial LSB ladder 840 which also connects to the MSB Low output line and the MSB LSB0 output line of switching unit 630. The MSB LSB0 outputline allows to tap the lowest connection point of the entire LSB ladder wherein the MSB Low output line connects to the lowest node of the ladder and the MSB High output line to the highest node of the LSB ladder. A node of the LSB ladder is considered to be formed by the connection point between two adjacent resistors of the LSB ladder.

The three outputs of each MSB units 630 are coupled in parallel with the LSB unit 640 which is shown in FIG. 6 and in more detail in FIG. 8. As explained above, a plurality of partial ladders can be implemented. FIG. 8 shows four partial LSB ladders, wherein partial ladders 810, 820, 830 each include a resistor ladder with 32 series connected resistors and partial ladder 840 a resistor ladder with 30 series connected resistors. Thus, the entire resistor ladder formed by the blocks 810, 820, 830 and 840 comprise 126 series connected resistors. The switch unit 630 provides for the first and last resistors and complements the LSB resistor ladder to 128 resistors. The specific arrangement of FIG. 8 allows to tap any of the 127 nodes and the bottom connection resulting in 128 different connections. The effective voltage output is selected by 5 LSB bits selecting the tapping point within each block 810, 820, 830, and 840 and 2 bits selecting the output voltage of one of the blocks 810, 820, 830 or 840.

Hence, this specific embodiment implements a 12-bit DAC wherein 5 decode bits are used to select one of the 32 MSB units 630 and 7 decode bits are assigned to the LSB section to select the output of one of four LSB blocks 810, 820, 830, and 840 via 2 of the decode bits and tap the LSB ladder via one of 32 bits within each LSB Block 640. The four LSB blocks 810, 820, 830, and 840 comprise three LSB blocks 810, 820, and 8390 of a first kind as shown in more detail in FIG. 9 and one LSB block 840 of a second kind as shown in more detail for example in FIG. 10. Thus, the first LSB blocks 810, 820, and 830 and the second LSB block 840 form the resulting LSB ladder wherein the first and last "resistors" are formed by the plurality of p-channel depletion transistors 720 and 760, respectively within each MSB switch unit 630 as shown in FIG. 7. Thus, losses through the coupling switches are entirely avoided as the coupling switches can be seen as part of the LSB resistor ladder. As will be apparent other configuration can be implemented. For example, more than four block could be used to form a larger LSB ladder. However, a single block could also be used in the form of a single block 840.

Figure 9:
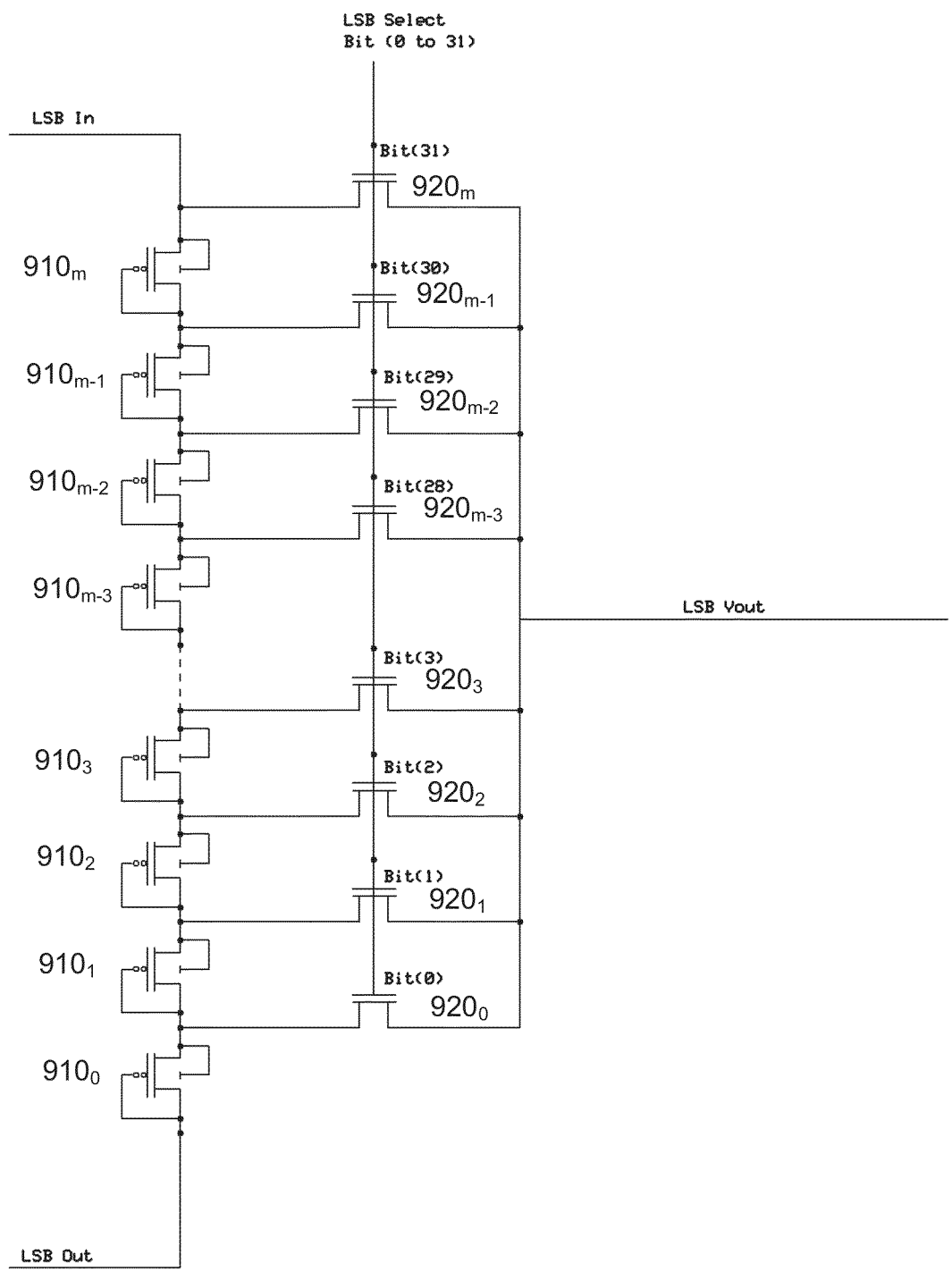
FIG. 9 shows details of the DAC LSB Block A of FIG. 8.
Figure 10:
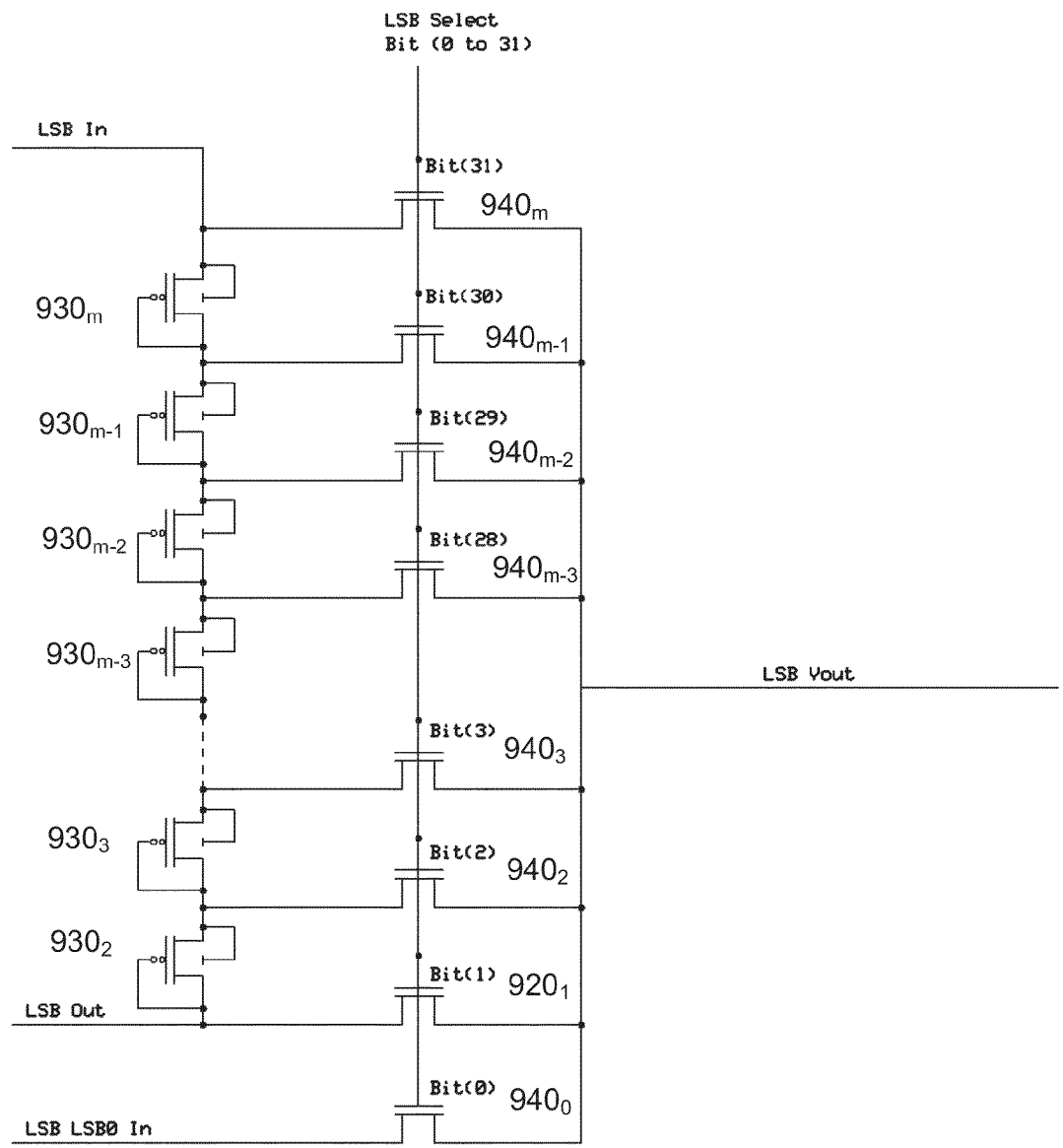
FIG. 10 shows details of the DAC LSB Block B of FIG. 8.

FIG. 9 shows one of the first LSB block as implemented by LSB blocks 810, 820, and 830. The resistor ladder is formed by diode connected P-channel depletion MOSFETs $910_{0-q}$. One of 32 taps can be selected by N-channel MOSFET switches $920_{0-q}$ that connects one of the taps formed by the resistor ladder with the LSB voltage output (LSB Vout). FIG. 10 shows the second type LSB block 840 which basically is similar to the one shown in FIG. 9 with the exception that the resistor ladder is shortened by two diode connected MOSFETs wherein the number of tap switches is maintained. The bit (0) switch $940_0$ then connects the LSB LSB0 input line (LSB LSB0 In) with the LSB voltage output line (LSB Vout) and the Bit(1) switch $940_1$ connects the LSB output line (LSB Out) with the LSB voltage output line (LSB Vout).

Figure 11A:
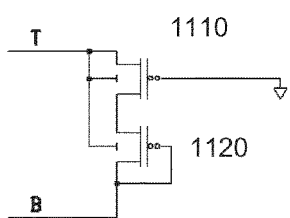
FIG. 11a,b shows details of different version of the DAC LSB compensation Block A of FIG. 6.
Figure 11B:
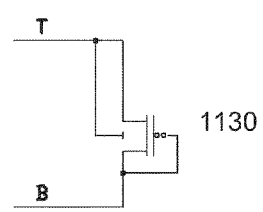

FIG. 6 also shows compensation switches A 610 and B 620 on the left side. Details of possible implementations of these compensation switches 610 and 620 are shown in FIGS. 11a,b and 12a,b. LSB compensation for the first 32 bits is provided by switch units A which can be implemented as shown in FIG. 11a or FIG. 11b. If these are not included the circuit may not get a true Vref/2 due to losses and inaccuracies of the resistors. However, other trimming methods, such as laser trimming, etc. may be used according to other embodiments. FIG. 12 shows the LSB compensation for the lower 32 bits, i.e. the active DAC core MSB's.

As mentioned above and as shown for example in FIG. 6, there are 32 resistors to create $V_{dd}/2$ which can be used as the $V_{ref}$ for the DAC core. There are 2 different versions of the LSB compensation circuits according to some embodiments.

The LSB compensation may be needed when switching in the LSB ladder across the MSB because it may create a small change in the resistance of the MSB "element". As shown in FIGS. 11a,b and 12a,b, the compensation switching devices are again P-channel depletion transistors but they are selectively sized to "look" the same as the full 128 bits of LSB.

Figure 12A:
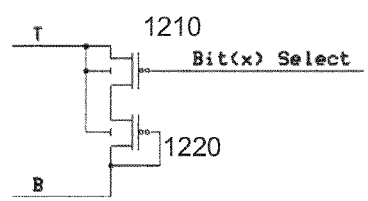
FIG. 12a,b shows details of different version of the DAC LSB compensation Block B of FIG. 6.
Figure 12B:
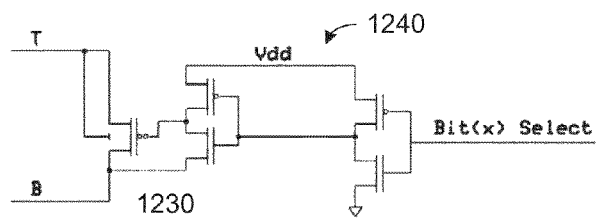

As can be seen while the first compensation switches as shown in FIGS. 11a and 11b are static and provide a fixed compensation for each respective resistor, the lower 32 second compensation switches as shown in FIGS. 12a and 12b are dynamically controlled depending on the respective Bit (x) value. The first possible implementation of the first compensation circuit as shown in FIG. 11a comprises two series connected P-channel depletion MOSFETs 1110 and 1120, wherein the top transistor 1110 has a gate connected to ground and the bottom MOSFET 1120 is connected as a diode. The series connected load paths are connected to the respective top and bottom connections of the MSB resistor. The equivalent second type compensation circuit as shown in FIG. 12a also comprises two series connected P-channel depletion MOSFETs 1210 and 1220, however, the gate of MOSFET 1210 is now controlled by the Bit(x) selection line.

FIG. 11b shows an alternative implementation of the first compensation circuit which uses only a single P-channel depletion MOSFET 1130. This MOSFET 1130 is simply connected as a diode. Between the top and bottom connections for each resistor. FIG. 12b shows the respective Bit(x) selection line controlled circuit. Here the diode connection of transistor 1230 is formed depending on the Bit(x) selection signal. To this end a two stage switch is formed to provide the respective switching. Two stages are used here as each stage operates as a simple inverter.

The transistor specifications for these compensation switching transistors of the first and second compensation switches are chosen depending on the design of the respective resistor ladder and its individual resistor values to provide for a proper compensation.

What is claimed is:

1. A digital-to analog-converter (DAC) comprising:
    an MSB resistor ladder comprising a plurality of series connected MSB resistors, wherein the MSB resistor ladder is coupled between a first and second reference potential;
        a partial LSB resistor ladder comprising a plurality of series connected resistors; and
        a plurality of switching units for connecting at least one of said series connected MSB resistors of the MSB resistor ladder with the partial LSB resistor ladder, wherein each switching unit comprises a first switch for connecting a first terminal of an associated MSB resistor with a first terminal of the partial LSB resistor ladder and a second switch for connecting a second terminal of the associated MSB resistor with a second terminal of the partial LSB resistor ladder and wherein a switch path of each switch is configured to form a resistor and wherein when said first and second switches are turned on, the first switch, the partial LSB resistor ladder and the second switch form an LSB resistor ladder connected in a parallel with the associated MSB resistor.

2. The digital-to analog-converter according to claim 1, further comprising a decoder for controlling one of the switching units to connect an associated MSB resistor of the MSB resistor ladder with the partial LSB resistor ladder and for selecting one of a plurality of tapping nodes of the LSB resistor ladder for providing an output voltage of the DAC.

3. The digital-to analog-converter according to claim 2, wherein each tapping node is coupled with an output of the LSB resistor ladder by an N-channel field effect transistor.

4. The digital-to analog-converter according to claim 1, wherein each first and second switch of the plurality of switching units is formed by a p-channel depletion field effect transistor.

5. The digital-to analog-converter according to claim 4, wherein the partial LSB resistor ladder is formed by a plurality of p-channel depletion transistors connected as diodes.

6. The digital-to analog-converter according to claim 5, wherein the partial LSB resistor ladder is formed by a plurality of sub LSB resistor ladders coupled in series.

7. The digital-to analog-converter according to claim 6, wherein each switching unit has a first and a second output connected with the first and second switch, respectively and further comprises a third switch for directly connecting the second terminal of an associated MSB resistor with a third output, wherein the first of the sub LSB resistor ladders is connected with the first output and the last of the sub LSB resistor ladders is connected with the second and third output.

8. The digital-to analog-converter according to claim 7, wherein the third switch is an N-channel field effect transistor.

9. The digital-to analog-converter according to claim 8, wherein each of the sub LSB resistor ladders comprises $2^q$ resistors except for the last sub LSB resistor ladder which comprises $2^q-2$ resistors and wherein the last LSB resistor ladder comprises a direct connection between a third input connected with the third output of the switching unit and a LSB resistor ladder output, wherein q is a positive integer.

10. The digital-to analog-converter according to claim 9, wherein q=3.

11. The digital-to analog-converter according to claim 1, wherein the MSB resistor ladder comprises $2^p$ resistors and an effective LSB resistor ladder formed by a switching unit and the LSB resistor ladder comprises $2^m$ resistors.

12. The digital-to analog-converter according to claim 11, wherein p=32 and m=128.

13. The digital-to analog-converter according to claim 1, wherein the first reference potential is one half of a supply voltage and the second reference potential is ground.

14. The digital-to analog-converter according to claim 13, wherein the first reference potential is provided by a reference resistor ladder coupled in series with the MSB resistor ladder.

15. The digital-to analog-converter according to claim 14, further comprising compensation circuits for each resistor of the reference resistor ladder.

16. The digital-to analog-converter according to claim 1, further comprising a compensation circuit for each resistor of the MSB resistor ladder.

17. The digital-to analog-converter according to claim 16, wherein each compensation circuit is controlled depending on a MSB input value.

18. A method of generating an analog voltage from a digital value comprising the steps of:
    providing an MSB resistor ladder comprising a plurality of series connected resistors between a first and second reference potential;
    providing a partial LSB resistor ladder comprising a plurality of series connected resistors;
    depending on an MSB value selectively connecting a first terminal of a selected MSB resistor with a first terminal of the partial LSB resistor ladder by a first switch and connecting second terminal of the selected MSB resistor with a second terminal of the partial LSB resistor ladder by a second switch, wherein a switch path of each switch is configured to form a resistor and wherein when said first and second switches are turned on, the first switch, the partial LSB resistor ladder and the second switch form an LSB resistor ladder connected in parallel with the selected MSB resistor; and
    depending on an LSB value selecting a tapping node of the LSB resistor ladder to provide an analog output voltage.

19. The method according to claim 18, wherein each tapping node is coupled with an output of the LSB resistor ladder by an N-channel field effect transistor.

20. The method according to claim 18, wherein each first and second switch of the plurality of switching units is formed by a p-channel depletion field effect transistor.

21. The method according to claim 20, wherein the partial LSB resistor ladder is formed by a plurality of p-channel depletion transistors connected as diodes.

22. The method according to claim 21, wherein the partial LSB resistor ladder is formed by a plurality of sub LSB resistor ladders coupled by series.

23. The method according to claim 18, wherein the first reference potential is one half of a supply voltage and the second reference potential is ground.

24. The method according to claim 23, further comprising providing the first reference potential by a reference resistor ladder coupled in series with the MSB resistor ladder.

25. The method according to claim 24, further comprising compensating each resistor of the reference resistor ladder.

26. The method to claim 18, further comprising compensating each resistor value of the MSB resistor ladder depending on the MS value.

\* \* \* \* \*

UNITED STATES PATENT AND TRADEMARK OFFICE
CERTIFICATE OF CORRECTION

| | | |
|---|---|---|
| PATENT NO. | : 8,896,473 B2 | Page 1 of 1 |
| APPLICATION NO. | : 13/897955 | |
| DATED | : November 25, 2014 | |
| INVENTOR(S) | : Gregory Dix | |

It is certified that error appears in the above-identified patent and that said Letters Patent is hereby corrected as shown below:

In the Claims,

Column 8,
Claim 10, line 4 "...wherein q=3..." ---Change to --- "...wherein q=32..."

Signed and Sealed this
Third Day of March, 2015

Michelle K. Lee
*Deputy Director of the United States Patent and Trademark Office*